(12) United States Patent
Buks et al.

(10) Patent No.: US 6,307,389 B1
(45) Date of Patent: *Oct. 23, 2001

(54) TEST DEVICE FOR FLAT ELECTRONIC ASSEMBLIES

(75) Inventors: Manfred Buks, Henstedt-Ulzberg; Peter Schaller, Berlin; Jens Krueger, Tangstedt, all of (DE)

(73) Assignee: Scorpion Technologies AG, Hamburg (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/875,666

(22) PCT Filed: Jan. 24, 1996

(86) PCT No.: PCT/EP96/00280

§ 371 Date: Dec. 22, 1997

§ 102(e) Date: Dec. 22, 1997

(87) PCT Pub. No.: WO96/24069

PCT Pub. Date: Aug. 8, 1996

(30) Foreign Application Priority Data

Feb. 2, 1995 (DE) .............................................. 195 03 329

(51) Int. Cl.$^7$ ........................................................ G01R 1/02
(52) U.S. Cl. ............................................. 324/758; 324/761
(58) Field of Search .................................. 324/754, 758, 324/761

(56) References Cited

U.S. PATENT DOCUMENTS 3,185,927   5/1965   Margulis et al. .................... 324/759
5,107,206 * 4/1992   Yanagi et al. ........................ 324/754
5,850,146 * 12/1998  Shim et al. .......................... 324/758

FOREIGN PATENT DOCUMENTS 0 458 280   11/1991   (EP) .
0 468 153   1/1992    (EP) .

* cited by examiner

Primary Examiner—Glenn W. Brown
(74) Attorney, Agent, or Firm—Walter C. Farley

(57) ABSTRACT

A test device for testing an electronic board assembly with an exposed surface area with electrical connection locations to be contacted for testing includes a probe (32, 45) and a drive system for positioning the probe in orthogonal X and Y directions parallel with the surface area. The drive system includes a probe drive (11) for positioning the probe to contact a selected sub-area of the surface area, the probe drive being movable in all movement coordinates independently of any other probe drives in said test device. The sub-area is selected to include component locations (34) on the board assembly. Several probe drives (11) and several probes can be used at one time, each drive having a probe (13). The probe drives are supported so that the probes (13) can be moved to contact sub-areas adjacent to each other. The probe is an elongated needle with a contact tip and is mounted for pivotal movement. A probe drive can include two transverse drives (15, 17) disposed at different distances from the surface area and movable in different directions (X, Y), at least one of the transverse drives including a gimbal mount for holding the needle (13) for universal movement, the needle being longitudinally movable in the gimbal mount. A vertical drive longitudinally moves the needle and probe toward and away from the surface area.

20 Claims, 5 Drawing Sheets

TEST DEVICE FOR FLAT ELECTRONIC ASSEMBLIES

FIELD OF THE INVENTION

The invention relates to a test device of the type having a probe movable over an electronic board assembly by a controllable drive for testing the electronic board assembly.

BACKGROUND OF THE INVENTION

Test devices of this kind are used for checking electronic board assemblies of the most diverse type. Board assemblies of this kind may, for example, be circuit boards, either with or without components, or, for example, highly integrated circuits, of which a plurality are disposed on a wafer, for IC manufacture. The probes may also be of the most diverse kind, for example electric contact points adapted to be connected via relay banks to stimulus sources or measuring amplifiers of a suitable electronic measuring device, or other probes used for other test methods, such as, for example, inductive or capacitive sensors or optical scanners, e.g. cameras or microscopes.

For the rapid testing of relatively large board assemblies, such as, for example, computer motherboards, a plurality of probes are usually provided, which can be positioned independently of one another. A plurality of probes are frequently also necessary so that when a plurality of electric junction points are to be contacted simultaneously it may be possible, for example, to apply a voltage to two junction points and tap off a voltage at a third junction point. Control of the probes is usually effected by means of sequence programs compiled individually for a specific board assembly.

Known test devices of this type are always so constructed that all the probes can be positioned over the total area of the maximum board assembly which can still be tested on the test device. In the conventional construction, the probes are disposed on slides which are adapted to move over the surface of the board assembly by means of spindles in the X-direction and the Y-direction. In the case of raisable and lowerable contact points, vertical drives operating in the Z-direction are provided on the slides.

In the known test devices, the slide guides and drives have to be movable over the entire length of the board assembly for testing, i.e. over considerable lengths which, in the case of a typical PC circuit board, amount to 30×40 cm for example. With these considerable traversing distances high spatial resolutions are required. For example, the individual contact pins of modern ICs must be controlled with a length resolution of much less than $\frac{1}{10}$ mm. Consequently, extremely stable and heavy mountings and drives are required for the slides, resulting in high moving masses.

A disadvantage of such test devices is the low speed of travel from one point to another, due to the high moving masses. High masses have to be continually accelerated and stopped. Decay times also have to be taken into account.

In modern production lines, for example for electronic equipment, board assemblies are, however, produced at a speed such that known test devices of the type according to the preamble are too slow. Consequently, only individual selected board assemblies can be tested, or else a plurality of test devices have to be used in parallel.

In contrast, test devices having a separate probe for each grid point of the board assembly, i.e. those operating with stationary probes and which do not have the above-mentioned speed problems, have advantages in terms of speed. These test devices, however, are disadvantageous in terms of circuitry and cost, and particularly in respect of the fixed arrangement of the items under test. They are therefore suitable only for a specific board assembly manufactured on a large scale, while the test devices with their movable probes, are suitable for rapid changeover to different board assemblies, i.e. for testing small-scale production runs.

SUMMARY OF THE INVENTION

An object of the present invention is to provide a test device for testing electronic board assembles with a higher test speed.

With this construction, the advantage of the test devices of the type described above, i.e. to be able to test even larger board assemblies with just one probe or just a few movable probes, is retained. Compared with the known test devices in this area, the advantage lies in the fact that a probe can be driven by a probe drive over just a sub-area of the total board assembly area. The traversed distances are thus reduced and the moving masses can be reduced by several orders of magnitude with the same or better control accuracy. This results in a traversing speed which can be correspondingly increased by several orders of magnitude. For specific applications, e.g. a large board with just one IC, it is sufficient to provide the sub-area in the size of the IC. The other few test points of the board can be tested in some other way. If a plurality of probes are provided with corresponding sub-areas, the probe drives can, for example, be provided to be movable between different sub-areas of the board assembly or be provided in a plurality so as to be stationary covering the total area. With only a slightly increased mechanical outlay, the test speed is considerably increased as a result of reducing the driven masses, and this test speed is sufficient even for the most up-to-date production lines. This construction also gives the possibility of considerable further increase of the speed by increasing the number of probes and probe drives.

Electronic circuit boards which are already equipped with components, the most commonly encountered testing situation, are today predominantly equipped with ICs of standard size. If the sub-areas are adapted to the ICs, it is sufficient to position probe drives over all the ICs or move one or more probe drives from one IC to the next, in order to be able to approach all the test points to be covered.

Advantageously, for example, a plurality of probe drives can be disposed in one line and be moved by a main drive successively transversely to the direction of the line over a larger board. Probe drives can also be arranged to be stationary so as to cover the entire area of a board assembly for testing, and this may be of advantage particularly for smaller assemblies for testing. In the case of the latter construction, the test speeds which can be achieved are very high and hitherto unthinkable.

Probe drives can be provided on the slides of known test devices instead of the probes which were hitherto arranged to be stationary there, and be moved in relatively large steps by the main drives. Even if the main drives are very slow, as is usual in the prior art, this does not appreciably slow down the total testing time, since, with an optimised test sequence program, care can be taken to ensure that the main drive makes only a few steps while the far larger number of test steps is made by the very fast probe drives.

If the probe is disposed on a pivotable needle, it can also be moved beyond the base area of the probe drive. Probe drives can thus be disposed adjacent one another, with the probes able to operate so as to overlap in the boundary zone of two probe drives. In the present state of the art, pivoting drives can be constructed very easily and rapidly for the required control electronics. They offer the additional advantage of enabling difficultly accessible locations to be reached with an inclined needle, for example locations of the kind which are accessible only from the side but not directly from above.

The provision of two transverse drives as the probe drive is advantageously provided. With this construction, the pivoting of the needle can be achieved very easily with two linear drives. Test rigs have proved very rugged and extremely rapid.

Probes can, for example, operate optically, capacitively or without contact in some other manner, the distance from the surface location for testing on the board assembly being uncritical. In that case a vertical drive would not be required for the probe. However, at least in the case of electrically contacting probes constructed as a contact point a vertical drive is necessary to set down and raise the contact point at each test location. In such test devices, the providing a vertical drive for moving the probe perpendicular to the assembly surface is advantageous. By moving the contact point relatively to the probe drive the masses are again very low and the speeds of movement high for this drive as well.

It is advantageous to mount the needle for longitudinal displacement in both gimbal mounts and act on the rear end with the vertical drive to move the entire needle longitudinally. As a result, the needle is very easily constructed to be movable as a whole.

Alternatively, the contact point can be moved relatively to the needle. The needle thus becomes mechanically more complex but the moving masses are further reduced.

It is advantageous to provide a plurality of probe drives having different spatial resolutions. This creates a large number of possible variations for speed optimization. If, for example, an equipped printed circuit board assembly comprises some highly integrated ICs with a very close pattern of connecting pins to be contacted, but, for example, otherwise has a number of discrete components with a coarser pattern, maximum-resolution probe drives operating over a small area can be provided to approach the ICs and probe drives of lesser resolution can be used to approach the other contact locations. It is even possible, for example, to use probes movable by slow main drives for these other contact locations.

BRIEF DESCRIPTION OF THE DRAWINGS

The invention is illustrated by way of example and diagrammatically in the drawings wherein.

DESCRIPTION OF PREFERRED EMBODIMENTS

Figure 1:
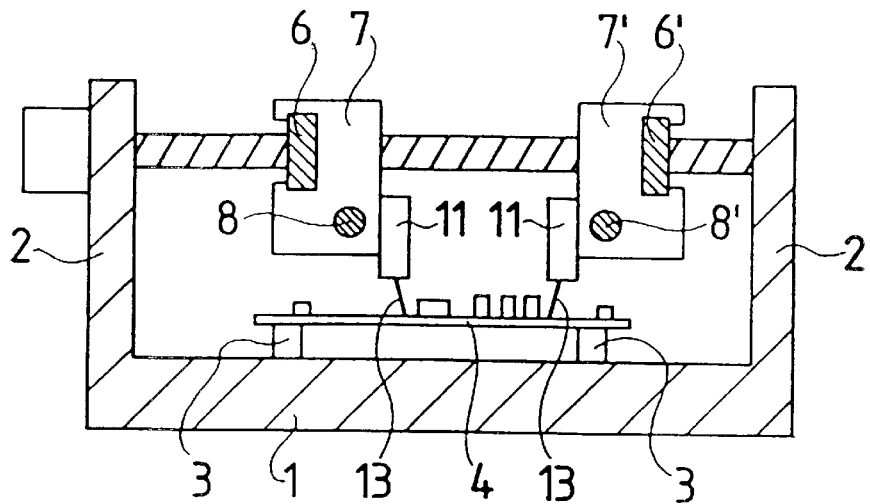
FIG. 1 is a section on the line 1—1 in FIG. 2 through a test devise.
Figure 2:
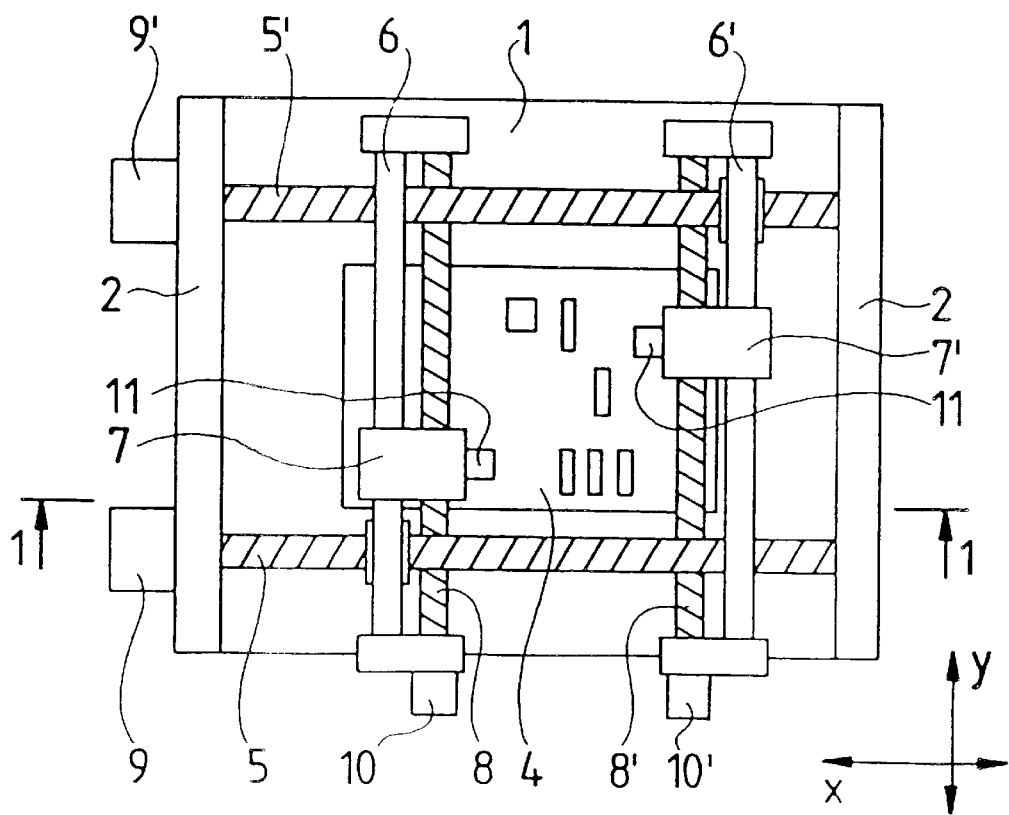
FIG. 2 is a plan view of FIG. 1.

FIGS. 1 and 2 show a test device with two moving probes, this device being of substantially known construction. A frame comprising a baseplate 1 and two cheeks 2 accommodates on the baseplate 1 by means of diagrammatically indicated holders 3 a circuit board 4 for testing. As will be seen from the Figures, the circuit board 4 is occupied by an array of ICs or other components.

Two spindles 5, 5' extend between the cheeks 2 in a traversing direction hereinafter referred to as the X-direction. Cross-members 6, 6' run on said spindles, one being driven by the spindle 5 and the other by the spindle 5'. Slides 7, 7' run on the cross-members 6, 6' and are driven in the Y-direction by transverse spindles 8, 8' mounted on the cross-members 6, 6' parallel thereto. Drive motors 9, 9' are provided for the spindles 5, 5' and drive motors 10, 10' for the transverse spindles 8, 8'.

With this conventional test device, the slides 7, 7' can be traversed over any desired point of the circuit board 4 by appropriate control of the motors 9, 9', 10, 10'. Each of the slides 7, 7' carries a probe drive 11 for a probe disposed at the end of a needle 13. A vertical drive is provided in the probe drives 11 to enable the needles 13 to be raised and lowered.

In order to simplify the drawing, leads extending from the probes to an electronic test device (not shown) and the electronic test device itself are omitted from the drawing.

By means of the test device of known construction as shown in FIGS. 1 and 2, the circuit board 4 can be contacted, for example, at two electrical junctions at any time and, for example, the current-flow resistance can be determined.

Conventionally, the test device illustrated is equipped with more probes. For example, there may be more than two cross-members provided, and a plurality of slides on each of these, so that a large number of probes can be used.

Known test devices of the type shown in FIGS. 1 and 2 hold the probes in a fixed position above the surface by means of the probe drives 11, which are constructed as rigid holders in the X-direction and the Y-direction. The drives provided in the X-direction and the Y-direction have to be moved for each change of location of one of the probe points. The test device illustrated is very large and very heavy in the case of the traversing distances required, for example 60 cm in the X-direction and 40 cm in the Y-direction, and with the positioning accuracies of less than $^1\!/_{10}$ mm required. High acceleration forces occur. The traversing speeds are correspondingly low.

The probe drives 11 are provided in order significantly to reduce the test speed, i.e. the average traversing speed of a probe, between two places to be contacted on the circuit board 4. This is explained in detail with reference to FIGS. 3 and 4.

The probe drive 11 is formed in a shaft 12 in the housing, in the interior of which drives are provided for the needle 13, which bears a contact point 32 as the probe at its bottom end.

First of all, a drive is provided for movement in the X-direction and the Y-direction, i.e. in the plane of the circuit board 4. It comprises a slide 15 movable in the X-direction in two rails 14, and a slide 17 movable in the Y-direction in rails 16. The linear drives provided in the X-direction and Y-direction in this way are disposed one above the other with vertical spacing. The slides are driven respectively by motors 18 and 19, which drive the slides 15, 17 via revolving endless belts 20, 21 and drivers 22, 23.

Each of the slides 15 and 17 bears a gimbal mount in the form of a ball 24 and 25 mounted for universal rotation in a spherical recess in the slide. The needle 13 extends through a bore in the balls 24 and 25 respectively so as to be longitudinally displaceable.

The needle 13 can be brought into any desired pivoted position by movement of the slides 15 and 17 by means of the motors 18 and 19 in the X-direction and Y-direction. The needle is longitudinally displaceable in the gimbal mounts of the balls 24, 25. A vertical drive provides vertical movement.

In the exemplified embodiment illustrated, the vertical drive comprises a motor 26 mounted on the housing shaft 12, said motor pivoting an arm 28 in the direction of the arrow (FIG. 3) via its output shaft 27. A pivoting arm 30 is mounted on the arm 28 by means of a pivoting bearing 29, the top end of the needle 13 being guided on the pivoting arm 30 by means of a plain bearing 31 shown in the form of a ring.

When pivoted by the slides 15 and 17 in the X-direction and Y-direction, the needle 13 is pivoted around the balls 24 and 25 respectively of the other slide, so that the top end of the needle 13 deflects correspondingly by means of the plain bearing 31. As a result of the displaceability of the plain bearing on the pivoting arm 30 and its pivotability about the pivoting bearing 20, the vertical drive can allow the entire pivoting range of the top end of the needle in permanent engagement.

If the contact point 32 at the bottom end of the needle 13 is required to occupy specific vertical positions, the vertical drive illustrated must take into account the pivoted position of the needle. This can be effected via appropriate computer control of the motor 26 provided for the vertical drive, taking into account the respective position of the slides 15 and 17 pivoting in the X-direction and the Y-direction.

Figure 3:
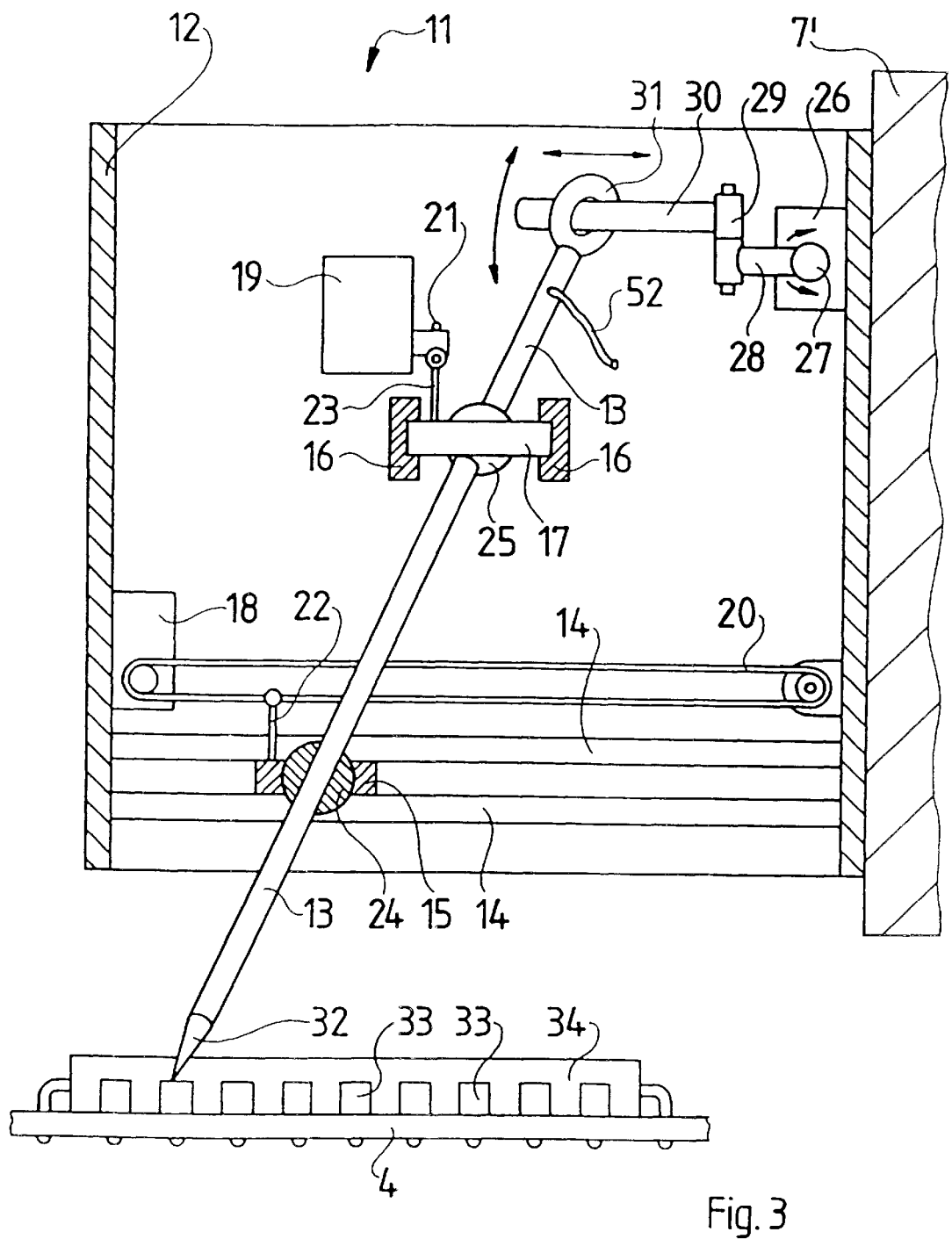
FIG. 3 is a vertical section through one of the probe drives provided in the test device of FIGS. 1 and 2.

As shown in FIG. 3 in the bottom part of the drawing, the needle 13 can, by its contact point 32, successively approach connecting tags 33 of an IC 34 soldered on the circuit board 4.

With the test device shown in its entirety in FIGS. 1 to 4, the circuit board 4 illustrated is tested with a test program which optimizes the distances traversed. The main drives comprising the motors 9, 9', 10, 10' are used as little as possible. They respectively move the probe drives 11 into a new position in which these drives can very rapidly reach a very large number of points by the much faster movement of the lightweight needle 13, the points being, for example, the various connecting tags 33 of the IC 34 shown in FIG. 3.

Figure 4:
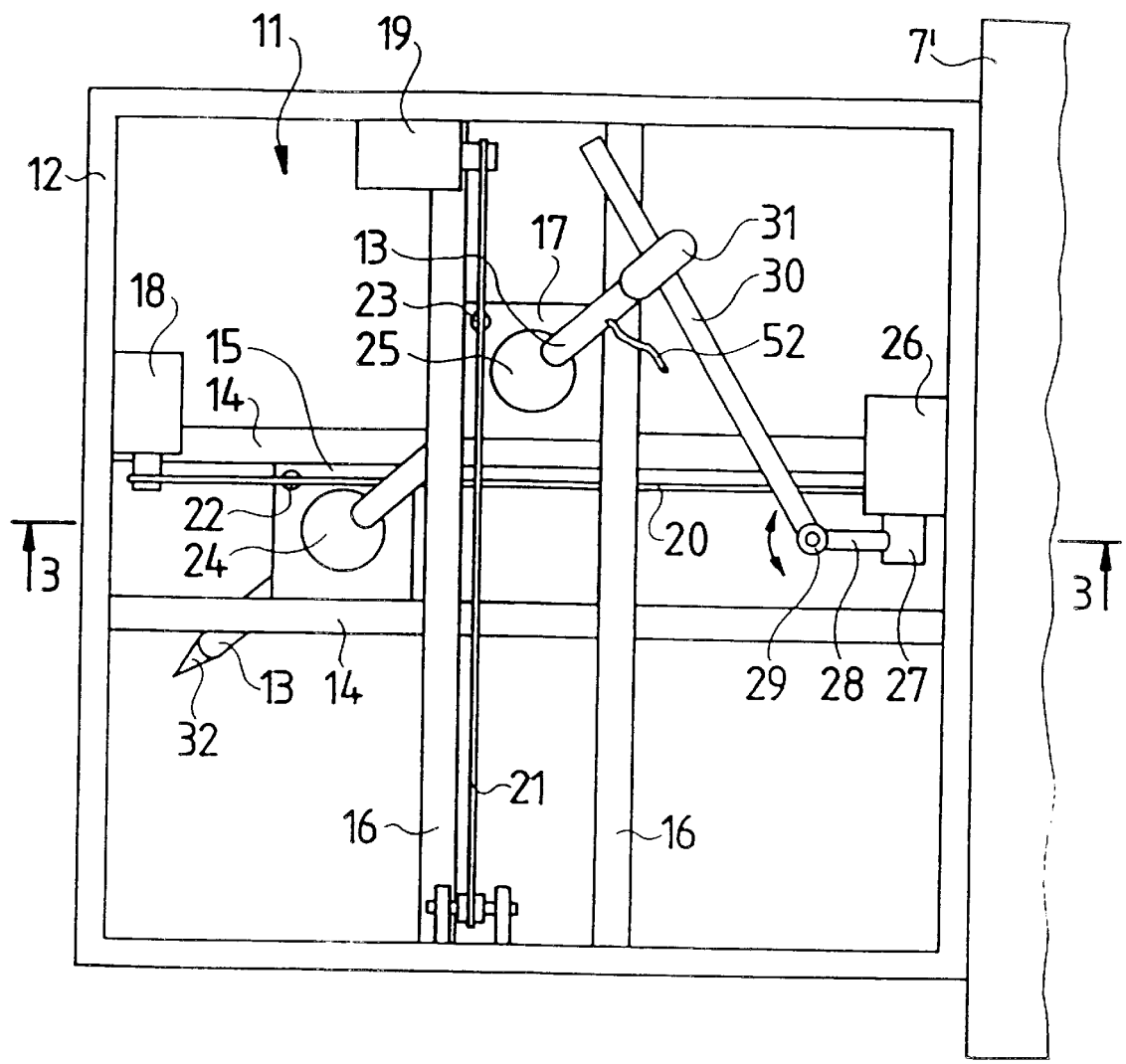
FIG. 4 is a plan view of the probe drive of FIG. 3.
Figure 5:
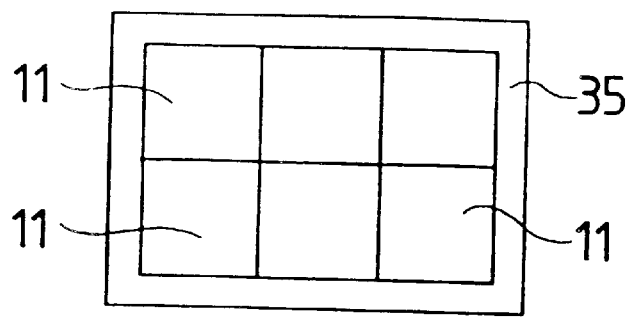
FIG. 5 is a plan view of a test device of a different form of construction with six stationary probe drives.
Figure 6:
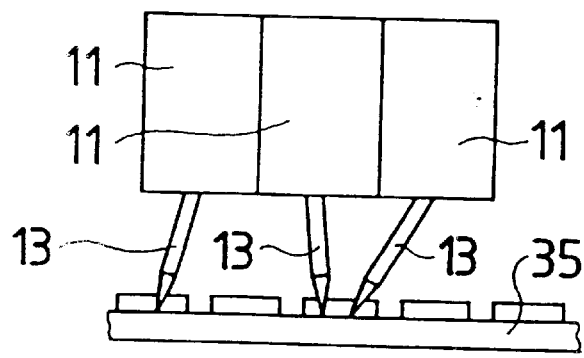
FIG. 6 is a side elevation of FIG. 5.

FIGS. 5 and 6 show a basic constructional variant in which a plurality of the probe drives 11 shown in FIGS. 3 and 4, namely, in the exemplified embodiment, six drives, are secured to one another in a fixed arrangement and are disposed by means of holders (not shown) above a circuit board 35 for testing. The six probe drives 11 shown, for the probes constructed as needles 13, are in this case stationary above the circuit board 35 during the test operation. Only the needles 13 move by means of the drives explained with reference to FIGS. 3 and 4, so that all the points to be contacted on the circuit board 35 can be reached. A solution of this kind is particularly suitable for smaller circuit boards.

In a variant, for example, a line consisting of a plurality of adjacent probe drives 11, as will be seen from the side in FIG. 6, are disposed in the form of a line on one of the cross-members 6, 6' of the test device shown in FIGS. 1 and 2. This line of probe drives can be moved over the circuit board 4 by moving the respective cross-member having the drive 5, 9; 5', 9' acting in the X-direction.

Figure 7:
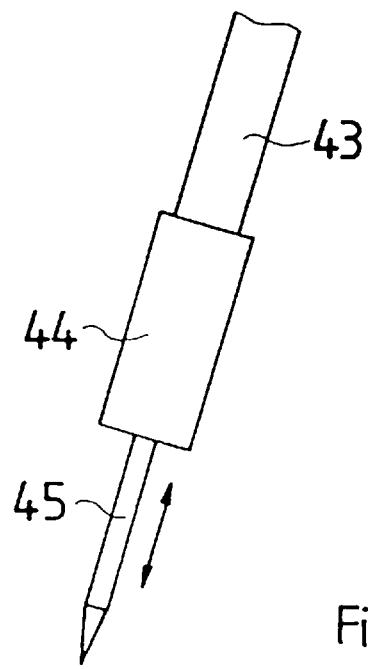
FIG. 7 is an elevation of the bottom end of the needle shown in FIG. 3, with a different vertical drive.

A number of other variants are possible compared with the embodiments illustrated. The probe drive 11 explained in FIGS. 3 and 4 comprises a vertical drive which moves the needle 13 vertically as a whole. Alternatively, as shown in FIG. 7, a needle 43 can carry a vertical drive 44 which moves the contact point 45 in the direction of the arrow relatively to the needle 43. The vertical drive can thus be significantly accelerated by reducing the vertically moving masses. The construction shown in FIGS. 3 and 4 is also simplified, since the vertical drive shown there is dispensed with. The needle 13 then no longer has to be mounted for longitudinal displacement in the two gimbal mounts, i.e. in the two balls 24 and 25. It can be held to be longitudinally stationary in one of the balls.

Figure 8:
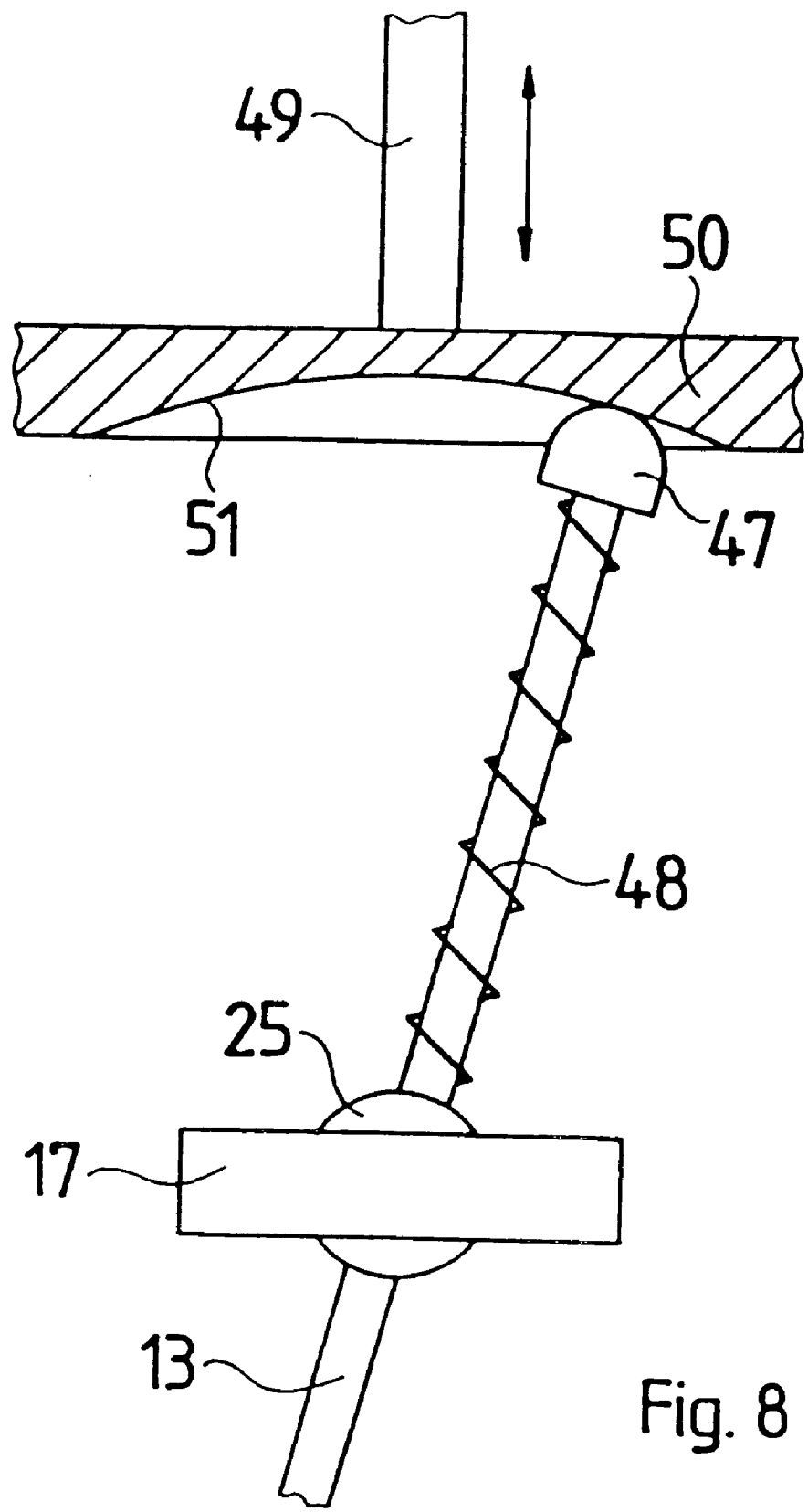
FIG. 8 is an elevation of the top end of the needle shown in FIG. 3, with another variant of the vertical drive.

FIG. 8 shows another variant for the vertical drive. As shown in FIGS. 3 and 4, the needle 13 is guided for longitudinal displacement in the balls 24 and 25. It is driven vertically from its top end, but with a different type of drive from that shown in FIGS. 3 and 4.

As shown in FIG. 8, a probe 47 is supported relative to the slide 17 at the top end of the needle 13 by means of a coil spring 48 and presses the needle 13 upwards. A plate 50 which is vertically movable in parallel relationship by means of a drive member 49 acts from above on the probe 47 and provides vertical movement of needle 13 against the force of the spring 48.

At the same time the plate 50 may have on its underside a recess 51 in the form of an ellipsoid cup, which is formed in two radii adapted to the spacing around the balls 24 and 25. The computing work for controlling the vertical drive motor 26 can thus be reduced.

In the preferred embodiment illustrated, the probe drive is in each case constructed as a needle pivoting drive. As shown by FIG. 6, for example, this has the advantage that the probe at the bottom end of the needle 13 can be moved beyond the base area of the respective probe drive 11, i.e. to overlap between adjacent probe drives. A comparison with FIG. 2 will show that the two probe drives 11 can be traversed side by side laterally and operate in overlapping relationship in the boundary zone.

Drives other than those illustrated can be used as the needle pivoting drives. For example, the needle can be pivoted about a central pivoting point by means of suitable drives. It can also be mounted above the slides 15 and 17 shown in FIGS. 3 and 4 to be pivotable at a fixed point, for example at the location of the bearing ring 31, i.e. at its top end. The slides 15 and 17 can then engage the needle by slots extending parallel to their rails.

It should also be noted that in this description, which is limited to the mechanical control, the electrical connections to the contact point 32 have been omitted. This is connected electrically through the needle 13 to a connecting lead 52 extending to an electronic tester (not shown). Depending on the test situation, in this tester the contact point 32 can be connected to a measuring amplifier or a stimulus source, e.g. a constant-voltage source or a constant-current source. Reference should be made to the appropriate extensive literature in connection with the appropriate test methods. For example, guard tests or parasitic transistor tests can be carried out in accordance with DE 41 10 551 C1.

Instead of the contact point 32 illustrated, which serves for electrical contacting, the needle 13 shown in the embodiments can also carry other probes, for example inductive or capacitive sensors, which in the example of FIG. 3 are not contacted with the tags 33, but brought into a specific spacing therefrom. The probes may also, for example, be optical devices, such as cameras or microscopes with a connected video camera, for high-resolution observation. Devices of this kind can also be used particularly in miniaturised form for testing integrated circuits on wafers.

Instead of the preferred needle pivoting drive for the probe as shown in the drawings, other mechanical drives can also be used as probe drives. For example, simple XY-drives, in which the X-drive is mounted on the Y-drive, can be used, with which a test point, for example in the form of a needle, can be moved in parallel relationship. Drives which pivot in a plane in superimposed relationship parallel to the circuit board for testing can also be used.

The test device explained with reference to FIGS. 1 to 4 can also be completed by an additional coarse vertical drive, by means of which the probe drives 11 are held on the slides 7, 7'. The drives may be slow vertical drives which are used only for special cases, for example when unusual vertical movements are required during the traversing of a larger component, where such vertical movements cannot be provided by the vertical drives in the probe drive 11.

What is claimed is:

1. A test device for testing an electronic board assembly having an exposed surface area comprising a plurality of sub-areas with electrical connection locations to be contacted for testing, the device comprising
    a probe (32, 45) for contacting locations on said exposed surface area for testing;
    a probe drive (11) for X-Y positioning said probe in any of a plurality of said locations to be contacted within any two-dimensional sub-area within said exposed surface area, said sub-area being smaller than said exposed surface area, and
    drive means for successively positioning said probe drive to more than one sub-area whereby said probe can contact and test locations in plural sub-areas of said exposed surface area.

2. The test device of claim 1 wherein each said sub-area is selected to include component locations (34) on said board assembly.

3. The test device of claim 1 comprising a plurality of probe drives (11), each said drive having a probe (13), and means for supporting and independently operating said probe drives so that ends of said probes (13) can be moved to contact locations in sub-areas adjacent to each other.

4. The test device of claim 1 wherein said drive means comprises a main drive having drive elements (7, 7') connected to position said probe drive (11) relative to said surface area.

5. The test device according to claim 1 wherein said probe (32) comprises an elongated needle (13) having a probe end, said needle being mounted for pivotal movement and being driven to selected angular positions relative to said surface area by said probe drive.

6. The test device according to claim 5 including a vertical drive for longitudinally moving said needle (13) to move said probe end (32, 45) toward and away from said surface area.

7. The test device according to claim 6 wherein said probe drive comprises X and Y transverse drives (15, 17) at different distances from said surface area, each of said transverse drives comprising a gimbal mount for holding said needle, said needle being longitudinally movable in said gimbal mounts and being actuated by a vertical drive (26, 30) at an end of said needle remote from said probe end.

8. The test device according to claim 5 wherein said probe end comprises an extendible portion and said vertical drive moves said probe end relative to said needle.

9. The test device according to claim 1 including a plurality of probe drives having different spatial resolutions.

10. A test device for testing an electronic board assembly having an exposed surface area with electrical connection locations to be contacted for testing, the device comprising
    a plurality of probes (32, 45) for contacting locations on said surface area for testing;
    a plurality of probe drives (11) each for positioning one said probe to said locations to be contacted within a two-dimensional subarea within said exposed surface area, each said sub-area being smaller than said surface area, each said probe being independently movable by its probe drive; and
    means for mounting each said probe drive in a substantially fixed location over said one sub-area of said surface area.

11. A test device according to claim 10 wherein said sub-areas are adjacent to each other.

12. The test device according to claim 11 wherein said adjacent sub-areas overlap.

13. The test device of claim 11 wherein each said sub-area is selected to include component locations (34) on said board assembly.

14. The test device of claim 10 wherein each said probe drive comprises a probe (13), and means for supporting and independently operating said probe drives so that ends of said probes (13) can be moved to contact locations in said sub-areas adjacent to each other.

15. The test device according to claim 10 wherein said probe (32) comprises an elongated needle (13) having a probe end, said needle being mounted for pivotal movement and being driven to selected angular positions relative to said surface area by said probe drive.

16. The test device according to claim 15 including a vertical drive for longitudinally moving said needle (13) to move said probe end (32, 45) toward and away from said surface area.

17. The test device according to claim 15 wherein each said probe drive comprises X and Y transverse drives (15, 17) at different distances from said surface area, each of said transverse drives comprising a gimbal mount for holding said needle, said needle being longitudinally movable in both said gimbal mounts and being actuated by a vertical drive (26, 30) at an end of said needle remote from said probe end.

18. The test device according to claim 15 wherein said probe end comprises an extendible portion and said vertical drive moves said probe end relative to said needle.

19. The test device according to claim 10 including a plurality of probe drives having different spatial resolutions.

20. A test device for testing an electronic board assembly having an exposed surface area with electrical connection locations to be contacted for testing, the device comprising
    at least one probe drive (11); and
    at least one probe (32, 45) comprising an elongated needle (13) having a probe end, said needle being mounted on one said probe drive for pivotal movement and being driven to selected angular positions relative to said surface area by said at least one probe drive for contact within a two-dimensional sub-area within said surface area, said sub-area being smaller than said surface area;
    each said probe drive comprises X and Y transverse drives (15, 17) at different distances from said surface area, each of said transverse drives comprising a gimbal mount for holding said needle, said needle being longitudinally movable in both said gimbal mounts and being actuated by a vertical drive (26, 30) at an end of said needle remote from said probe end.

* * * * *